United States Patent
Setterberg

(12) United States Patent (10) Patent No.: US 7,187,215 B2
Setterberg (45) Date of Patent: Mar. 6, 2007

(54) HIGH DYNAMIC RANGE CURRENT-MODE TRACK-AND-HOLD CIRCUIT

(75) Inventor: Brian D. Setterberg, Menlo Park, CA (US)

(73) Assignee: Agilent Technologies, Santa Clara, CA (US)

( * ) Notice: Subject to any disclaimer, the term of this patent is extended or adjusted under 35 U.S.C. 154(b) by 86 days.

(21) Appl. No.: 11/034,990

(22) Filed: Jan. 12, 2005

(65) Prior Publication Data

US 2006/0152251 A1    Jul. 13, 2006

(51) Int. Cl.
*G11C 27/02* (2006.01)
(52) U.S. Cl. .......................... 327/94; 341/122
(58) Field of Classification Search .............. 327/94; 341/122
See application file for complete search history.

(56) References Cited

U.S. PATENT DOCUMENTS 4,866,368 A * 9/1989 Bird ............................ 323/316
5,227,676 A * 7/1993 Bahr et al. ..................... 327/94
5,418,408 A * 5/1995 Mangelsdorf et al. ......... 327/95
5,963,158 A * 10/1999 Yasuda ........................ 341/136

* cited by examiner

*Primary Examiner*—Timothy P. Callahan
*Assistant Examiner*—Terry L. Englund
(74) *Attorney, Agent, or Firm*—Ian Hardcastle

(57) ABSTRACT

Embodiments of the current-mode track and hold circuit comprise a cascode input stage, a dynamic biasing stage, a cascode output stage, and a switch operable to interconnect the input stage and the output stage. The input stage is connected to receive an input current. The dynamic biasing stage is connected to receive a scaled version of the input current as a dynamic biasing current and dynamically biases the input stage in response to the dynamic biasing current. Dynamically biasing the track-and-hold circuit in response to a dynamic biasing current that is a scaled version of the input current significantly increases the maximum peak-to-peak voltage swing allowed at the input of the track-and-hold circuit and enables a corresponding increase in signal-to-noise ratio. These benefits are obtained at the expense of only a small increase in power consumption.

31 Claims, 2 Drawing Sheets

HIGH DYNAMIC RANGE CURRENT-MODE TRACK-AND-HOLD CIRCUIT

BACKGROUND

Track-and-hold circuits are used in many electronic devices. A track-and-hold circuit operates in response to a control signal. In one state of the control signal, the output of the track-and-hold circuit follows the input of the track-and-hold circuit. In the other state of the control signal, the output is held at a constant level equal to the level of the input when the state of the control signal changed.

In one exemplary application of track-and-hold circuits described by Neff in U.S. Pat. No. 6,259,281, assigned to the assignee of this disclosure and incorporated by reference, a high-speed analog-to-digital converter incorporates multiple track-and-hold circuits. The output of each track-and-hold circuit is connected to the analog input of a respective analog-to-digital converter circuit. The inputs of the track-and-hold circuits are all connected to receive the analog input signal. The track-and-hold circuits are each controlled by a respective phase of a multi-phase control signal. The number of phases of the control signal is equal to the number of track-and-hold circuits. The output of each track-and-hold circuit follows the analog input signal and then is held at a constant level as described above. The time at which each track-and-hold circuit switches to its HOLD state is determined by the phase of the control signal received by the track-and-hold circuit. Each track-and-hold circuit holds its output at a constant level long enough for the corresponding analog-to-digital converter circuit to convert the output level to a respective digital value. With this arrangement, the analog-to-digital converter has a maximum sampling rate that is a multiple of the maximum sampling rate of its constituent analog-to-digital converter circuits, where the multiple is equal to the number of analog-to-digital converter circuits.

Track-and-hold circuits have traditionally been voltage-mode devices that track a voltage input and provide a voltage output. More recently, as track-and-hold circuits have been made using higher-speed fabrication processes that require a substantially reduced supply voltage, the use of current-mode track-and-hold circuits that track a current input and generate a current output has increased. However, even current-mode track-and-hold circuits are subject to voltage swing limitations.

FIG. 1 is a schematic circuit diagram of a conventional current-mode track-and-hold circuit 10 in accordance with the prior art. The track-and-hold circuit is structured as a cascode current mirror circuit with a switch connected between the gates of the lower transistors. Specifically, track-and-hold circuit 10 is composed of a cascode input stage 20, a cascode output stage 22 and a switch 26.

Cascode input stage 20 is composed of an input transistor 30 and a first cascode transistor 32. Input transistor 30 has its source connected to supply rail $V_{SS}$, its gate connected to the drain of first cascode transistor 32 and to switch 26, and its drain connected to the source of first cascode transistor 32. First cascode transistor 32 has its drain connected to an input terminal 34 from which it receives an input current $I_{IN}$ and its gate connected to a static bias voltage supply $V_B$.

Cascode output stage 22 is composed of an output transistor 40 and a second cascode transistor 42. Output transistor 40 has its source connected to supply rail $V_{SS}$, its gate connected to switch 26, and its drain connected to the source of second cascode transistor 42. Second cascode transistor 42 has its gate connected to static bias voltage supply $V_B$ and its drain connected to output terminal 44 to which it provides an output current $I_{OUT}$. Embodiments for use in high-resolution, low-speed applications may additionally have a hold capacitor (not shown) connected between gate and source of output transistor 40.

To simplify the drawings, the source, gate and drain of the transistors that form the various track-and-hold circuits described in this disclosure are not identified by individual reference numerals. FIG. 2 is a schematic diagram of an exemplary transistor 60 in which the source, gate and drain are identified by the reference numerals 62, 64 and 66 respectively.

In a TRACK mode of track-and-hold circuit 10, switch 26 is closed and the output current $I_{OUT}$ and the input current $I_{IN}$ have a ratio defined by the ratio m of the width-to-length ratio of the channel of output transistor 40 to that of input transistor 30. Since transistors, such as output transistor 40 and input transistor 30, that provide a defined ratio between currents typically have equal channel lengths, the ratio m is typically defined by the ratio of the width of the channel of output transistor 40 to the width of the channel of input transistor 30.

Switch 26 opens to switch track-and-hold circuit 10 to a HOLD mode. In the HOLD mode, switch 26 is open and the voltage formerly applied through switch 26 to the gate of output transistor 40 continues to be applied by the parasitic capacitance of the gate of output transistor 40. The voltage held by the parasitic capacitance maintains the output current $I_{OUT}$ at a fixed level equal to its level at the time switch 26 opened. The output current remains at this level until switch 26 closes once again to restore track-and-hold circuit 10 to the TRACK state.

For proper operation of track-and-hold circuit 10, all four transistors 30, 32, 40 and 42 (collectively, the transistors) are kept in saturation. An analysis of the conditions for saturation shows that the maximum peak-to-peak voltage swing allowed on input terminal 34 of track-and-hold circuit 10 is approximately $V_t - V_{ov}$ where $V_t$ is the threshold voltage of the transistors and $V_{ov}$ is the gate overdrive voltage of first cascode transistor 32. The gate overdrive voltage is the difference between the gate-source voltage and the threshold voltage ($V_{gs} - V_t$) of first cascode transistor 32. In other words, the maximum peak-to-peak voltage swing allowed on input terminal 34 is less than the threshold voltage of the transistors.

The maximum peak-to-peak voltage swing allowed at the input terminal 34 of track-and-hold circuit 10 limits the achievable signal-to-noise ratio (SNR) of track-and-hold circuit 10. The SNR is determined by the ratio of the RMS signal voltage at the gate of output transistor 40 to the RMS thermal noise voltage at the gate of output transistor 40. The RMS thermal noise voltage is approximately $\sqrt{(kT/C_h)}$, where k is Boltzmann's constant, T is the absolute temperature and $C_h$ is the hold capacitance, i.e., the capacitance at the gate of output transistor 40. The principal component of the hold capacitance $C_h$ is the gate-to-source capacitance of output transistor 40. The hold capacitance additionally comprises wiring capacitance and the parasitic capacitance of switch 26.

With a sinusoidal input signal, the maximum RMS input voltage allowed at the gate of output transistor 40 is approximately $V_t/\sqrt{8}$. Consequently, the maximum 3SNR is approximately $V_t \sqrt{(C_h/8kT)}$.

Increasing the SNR of conventional track-and-hold circuit 10 is difficult. The threshold voltage $V_t$ is determined by the IC process used to fabricate the track-and-hold circuit. It is typically expensive and inconvenient to improve the SNR by applying cooling to reduce the temperature of the circuit. The remaining variable that can be changed to increase the SNR is the hold capacitance $C_h$. However, increasing the hold capacitance $C_h$ results in a proportional increase in the power consumption of track-and-hold circuit 10. Moreover, power consumption increases in direct proportion to the increase in the hold capacitance whereas the SNR only improves by the square root of the increase in the hold capacitance. This means, for example, that achieving a 3 dB improvement in SNR, i.e., doubling the SNR, multiplies the power consumption by a factor of four. With the current trend towards reducing power consumption, multiplying the power consumption is undesirable.

Accordingly, what is needed is a way to increase the SNR of a track-and-hold circuit without multiplying the power consumption and without other undesirable side effects.

SUMMARY OF THE INVENTION

In a first aspect, embodiments of the invention provide a current-mode track and hold circuit that comprises a cascode input stage, a dynamic biasing stage, a cascode output stage and a switch operable to interconnect the input stage and the output stage. The input stage is connected to receive an input current. The dynamic biasing stage is connected to receive a scaled version of the input current as a dynamic biasing current and dynamically biases the input stage in response to the dynamic biasing current.

In a second aspect, embodiments of the invention provide a method of tracking and holding an input current. In the method, a track-and-hold circuit is provided; a dynamic biasing current is generated as a scaled version of the input current; the track-and-hold circuit is dynamically biased using the dynamic biasing current; and the input current is tracked and held using the track-and-hold circuit dynamically biased using the dynamic biasing current.

Dynamically biasing the track-and-hold circuit in response to a dynamic biasing current that is a scaled version of the input current significantly increases the maximum peak-to-peak voltage swing allowed at the input of the track-and-hold circuit but incurs a relatively small increase in power consumption. The increased maximum peak-to-peak voltage swing provides a corresponding increase in signal-to-noise ratio.

DETAILED DESCRIPTION

Embodiments of a current-mode track-and-hold circuit in accordance with the invention have a dynamic biasing stage, a cascode input stage and a cascode output stage. The dynamic biasing stage dynamically biases the cascode transistor of the cascode input stage with a dynamic bias voltage generated in response to a dynamic biasing current. The dynamic biasing current is a scaled version of the input current.

Optionally, the dynamic biasing stage additionally biases the cascode transistor of the cascode output stage. Dynamically biasing at least the cascode input stage in response to a dynamic biasing current that is a scaled version of the input current increases the maximum peak-to-peak voltage swing allowed at the input terminal of the track-and-hold circuit. Increasing the maximum peak-to-peak voltage swing gives a corresponding increase in the signal-to-noise ratio (SNR) of the track-and-hold circuit. The increase in the SNR is obtained with only a small increase in power consumption.

Figure 3:
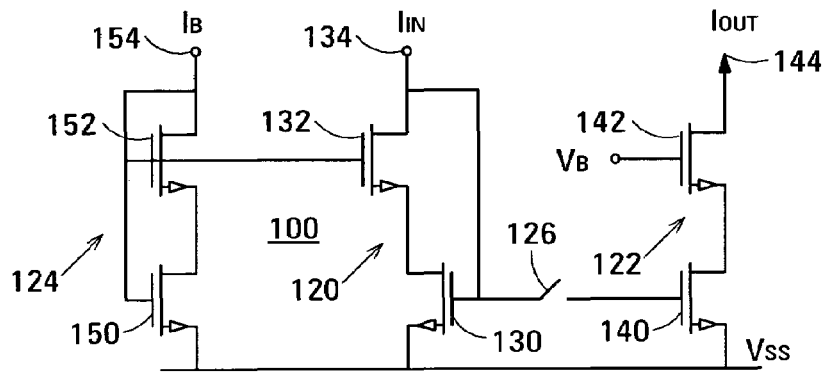
FIG. 3 is a schematic diagram of a first embodiment of a current-mode track-and-hold circuit in accordance with the invention.

FIG. 3 is a schematic diagram of a first embodiment 100 of a current-mode track-and-hold circuit in accordance with the invention. Track-and-hold circuit 100 is composed of a cascode input stage 120, a cascode output stage 122, a dynamic biasing stage 124 and a switch 126. Cascode input stage 120 is connected to receive an input current $I_{IN}$. Dynamic biasing stage 124 is connected to receive a scaled version of the input current as a dynamic biasing current $I_B$ and dynamically biases input stage 120 in response to the dynamic biasing current $I_B$. Cascode output stage 122 provides an output current $I_{OUT}$.

Cascode input stage 120 is composed of an input transistor 130 and a first cascode transistor 132 connected in series. Input transistor 130 has its source connected to a supply rail $V_{SS}$, its gate connected to the drain of first cascode transistor 132 and to switch 126, and its drain connected to the source of first cascode transistor 132. First cascode transistor 132 has its drain connected to an input terminal 134 from which it receives input current $I_{IN}$.

Cascode output stage 122 is composed of an output transistor 140 and a second cascode transistor 142 connected in series. Output transistor 140 has its source connected to supply rail $V_{SS}$, its gate connected to switch 126, and its drain connected to the source of second cascode transistor 142. Second cascode transistor 142 has its gate connected to a static bias voltage supply $V_B$ and its drain connected to output terminal 144 to which it provides the output current $I_{OUT}$. The output current $I_{OUT}$ and the input current $I_{IN}$ have a predetermined ratio defined by the ratio m of the width-to-length ratio of the channel of output transistor 140 to the width-to-length ratio of the channel of input transistor 130. The channels of input transistor 130 and output transistor 140 are typically equal in length.

Switch 126 is typically implemented using an additional transistor, but another type of switching element may be used. Switch 126 operates in response to a mode control signal (not shown). The mode control signal has a TRACK state that sets track-and-hold circuit 100 to its TRACK mode and a HOLD state that sets track-and-hold circuit 100 to its HOLD state. The mode control signal causes switch 126 to open at each transition of the control signal between its TRACK state and its HOLD state, and to close at each transition between the HOLD state and the TRACK state.

Dynamic biasing stage 124 is composed of a biasing stage transistor 150 and a diode-connected transistor 152 connected in series. Biasing stage transistor 150 has its source connected to supply rail $V_{SS}$ and its drain connected to the source of diode-connected transistor 152. Diode-connected transistor 152 has its gate connected to its drain to effect the diode connection. The gate and drain of diode-connected transistor 152 are additionally connected to the gate of biasing stage transistor 150 and the gate of the first cascode transistor 132 of cascode input stage 120. Finally, the gate and drain of diode-connected transistor 152 are connected to a bias current terminal 154 to receive dynamic biasing current $I_B$.

As noted above, the dynamic biasing current $I_B$ is a scaled version of the input current, $I_{IN}$. The scale factor b is typically in the range from about 0.05 to about 0.5. In one embodiment, the scale factor b is 0.1.

Figure 1:
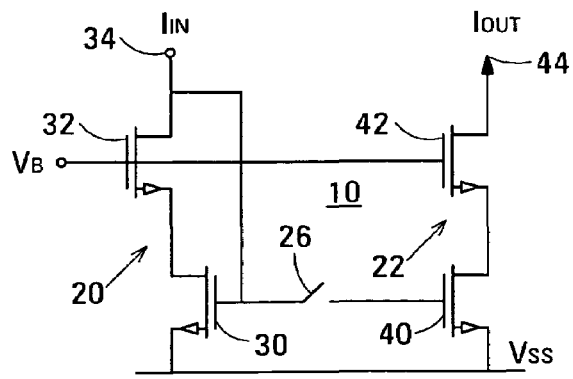
FIG. 1 is a schematic diagram of a current-mode track-and-hold circuit in accordance with the prior art.
Figure 2:
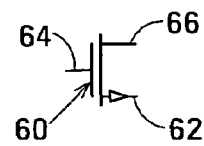
FIG. 2 is a schematic diagram of an exemplary transistor.

The dynamic biasing current in dynamic biasing stage 124 increases the power consumption of track-and-hold circuit 100 compared with the conventional track-and-hold circuit 10 shown in FIG. 1. However, track-and-hold circuit 100 has a significantly higher SNR. The increase in power consumption is negligible compared with that which would be required by the above-described conventional approach to increasing SNR to achieve a similar SNR in conventional track-and-hold circuit 10. In an example in which the scale factor b is 0.1, the dynamic biasing current increases the power consumption of cascode input stage 120 by 10%. The increase in the overall power consumption of track-and-hold circuit 100 depends on the current ratio m between cascode output stage 122 and cascode input stage 120. In an embodiment in which cascode output stage 122 additionally generates the dynamic biasing current for a following track-and-hold circuit, as will be described below, the overall power consumption increases in proportion to the scale factor b.

The width-to-length ratio of the channel of diode-connected transistor 152 is sized relative to that of first cascode transistor 132 to provide diode-connected transistor 152 with the same current density as first cascode transistor 132. Typically, diode-connected transistor 152 and first cascode transistor 132 have equal channel lengths. Since the gate voltages of first cascode transistor 132 and diode-connected transistor 152 are the same, the source voltages of these transistors are approximately equal, and the drain voltages of biasing stage transistor 150 and input transistor 130 are approximately equal. Since diode-connected transistor 152 is diode connected, it always operates in saturation.

Biasing stage transistor 150 always operates in triode mode and therefore behaves like a resistor. The width-to-length ratio of the channel of biasing stage transistor 150 is scaled to set the drain voltage of input transistor 130 a desired value. Since the dynamic biasing current $I_B$ is a scaled version of the input current $I_{IN}$, the dynamic bias voltage applied to the gate of first cascode transistor 132 by diode-connected transistor 152 adapts to changes in the input current $I_{IN}$ to keep input transistor 130 and first cascode transistor 132 in saturation over a wide range of input voltages on input terminal 134.

Operation of track-and-hold circuit 100 is otherwise similar to that of conventional track-and-hold circuit 10 described above with reference to FIG. 1 and will not be described again here.

In applications in which the input current $I_{IN}$ of the track-and-hold circuit 100 is internally generated, the stage that provides the input current $I_{IN}$ to track-and-hold circuit 100 can be configured to include a dynamic biasing current generator that generates the dynamic biasing current $I_B$ as a scaled version of the input current $I_{IN}$. The stage then provides the input current $I_{IN}$ and the dynamic biasing current $I_B$ to the input terminal 134 and the bias current terminal 154, respectively, of track-and-hold circuit 100.

Figure 4:
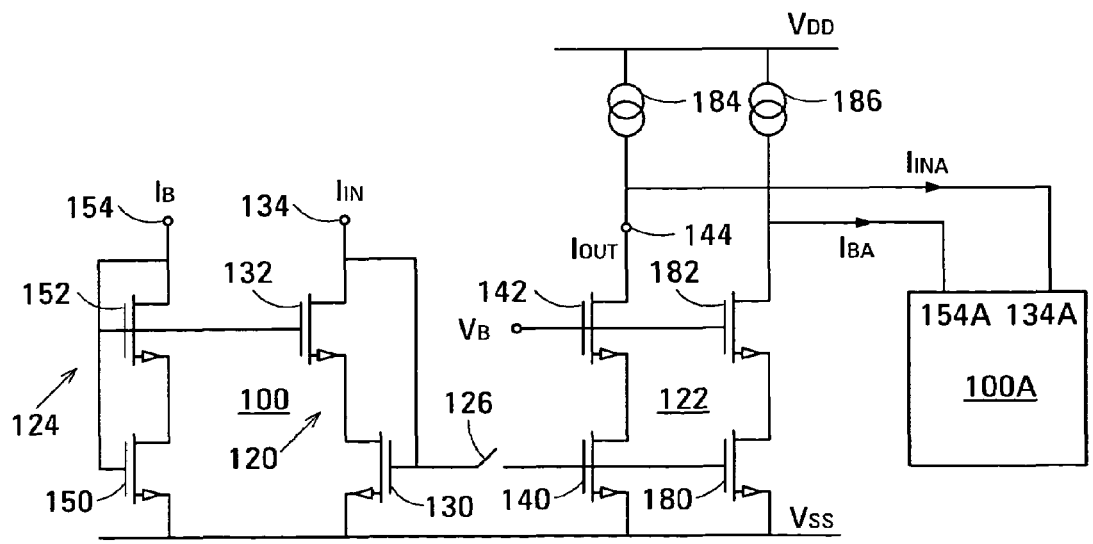
FIG. 4 is a schematic diagram of a first example of a dynamic biasing current generator.

FIG. 4 is a schematic diagram of a first example of a dynamic biasing current generator suitable for use in applications in which the input current $I_{IN}$ is internally generated. In the example shown, track-and-hold circuit 100 is followed by a track-and-hold circuit 100A similar to track-and-hold circuit 100. Track-and-hold circuit 100A has an input terminal 134A and a bias current terminal 154A.

In track-and-hold circuit 100, output transistor 140 is a first output transistor and output terminal 144 is connected via a first current source 184 to a supply rail VDD and is also connected to the input terminal 134A of track-and-hold circuit 100A. The arrangement shown provides to track-and-hold circuit 100A an input current $I_{INA}$ equal to the difference between the current provided by first current generator 184 and the output current $I_{out}$ provided by track-and-hold circuit 100.

The embodiment of output stage 122 of track-and-hold circuit 100 shown in FIG. 4 incorporates an additional cascode stage and a second current generator 186 that collectively supply a dynamic bias current $I_{BA}$ to the bias current terminal 154A of track-and-hold circuit 10A. The additional cascode stage is composed of a second output transistor 180 and a third cascode transistor 182. Second output transistor 180 has its source connected to supply rail $V_{SS}$, its gate connected to the gate of first output transistor 140 and its drain connected to the source of third cascode transistor 182. Third cascode transistor 182 has its gate connected to static bias voltage supply $V_B$ and its drain connected to second current source 186 and to bias current terminal 154A. The width-to-length ratio of the channel of second output transistor 180 and that of first output transistor 140 have a ratio equal to the desired scale factor b. The current provided by second current generator 186 and that provided by first current generator 184 have a ratio equal to the desired scale factor b. Accordingly, the dynamic bias current $I_{BA}$ provided to the bias current terminal 154A of track-and-hold circuit 100A is a scaled version of the input current $I_{INA}$ provided to the input terminal 134A of track-and-hold circuit 100A.

Figure 5:
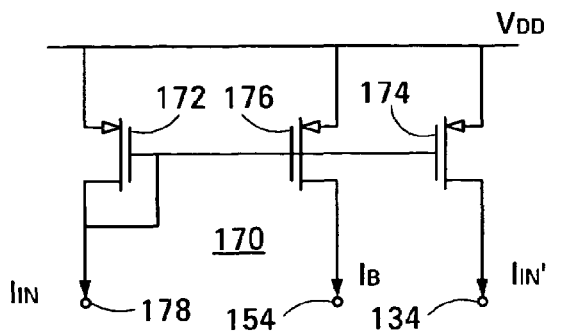
FIG. 5 is a schematic diagram of a second example of a dynamic biasing current generator.

FIG. 5 is a schematic diagram of a second example of a dynamic biasing current generator suitable for use in applications in which the input current $I_{IN}$ is received from an external source. The dynamic biasing current generator generates the dynamic biasing current $I_B$ from the input current $I_{IN}$ as a scaled version thereof.

Dynamic biasing current generator 170 is composed of a first transistor 172, a second transistor 174 and a third transistor 176. Transistors 172, 174 and 176 are all of the opposite conductivity type to the transistors of track-and-hold circuit 100. In the example shown, transistors 172, 174 and 176 are PMOS transistors.

The sources of transistors 172, 174 and 176 are all connected to a supply rail $V_{DD}$. The gates of transistors 172, 174 and 176 are connected to one another and to the drain of transistor 172. The drain of first transistor 172 is additionally connected to an input terminal 178 from which it receives input current $I_{IN}$. The drain of second transistor 174 is connected to the input terminal 134 of track-and-hold circuit 100 to deliver the input current $I_{IN}'$ thereto. The drain of third transistor 176 is connected to the bias current terminal 154 of track-and-hold circuit 100 to deliver the dynamic biasing current $I_B$ thereto.

The width-to-length ratio of the channel of second transistor 174 is made equal to that of first transistor 172 so that the input current $I_{IN}'$ provided to the input terminal 134 of track-and-hold circuit 100 is equal to the input current $I_{IN}$ received at the input terminal 178 of dynamic biasing current generator 170. The width-to-length ratio of the channel of third transistor 176 and that of first transistor 172 are scaled proportionally to the desired ratio b between the dynamic biasing current $I_B$ and the input current $I_{IN}$ received at the input terminal 178 of bias current generator 170. In an example in which the scale factor b of the dynamic biasing current is 0.1, the width-to-length ratio of the channel of transistor 176 is one-tenth of that of transistor 172. Typically, transistors 172, 174 and 176 have equal channel lengths.

In track-and-hold circuit 100, the drain voltage of output transistor 140 is less well matched to that of input transistor 130 than corresponding voltages in conventional track-and-hold circuit 10 described above with reference to FIG. 1.

This is because the gate voltage of second cascode transistor 142 is fixed by static bias voltage source $V_B$ whereas that of first cascode transistor 132 varies in response to the dynamic bias voltage provided by diode-connected transistor 152 in response to the dynamic biasing current $I_B$. The voltage mismatch reduces the accuracy of track-and-hold circuit 100 compared with that of the above-described conventional track-and-hold circuit.

Figure 6:
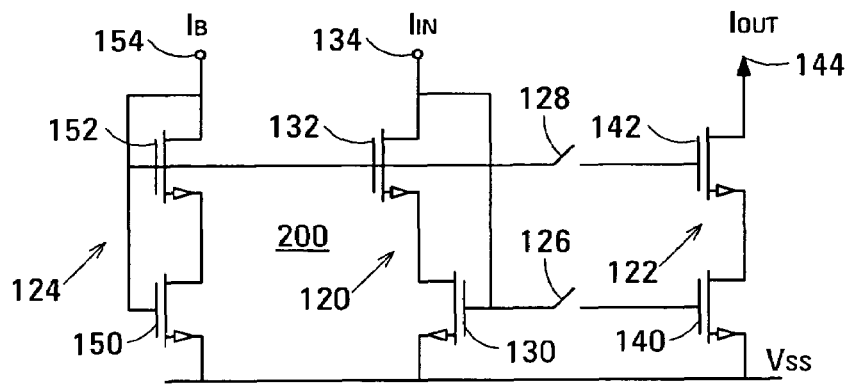
FIG. 6 is a schematic diagram of a second embodiment of a current-mode track-and-hold circuit in accordance with the invention.

FIG. 6 is a schematic diagram of a second embodiment 200 of a current-mode track-and-hold circuit in accordance with the invention. Elements of track-and-hold circuit 200 that correspond to elements of track-and-hold circuit 100 described above with reference to FIG. 3 are indicated using the same reference numerals and will not be described again here.

Track-and-hold circuit 200 is composed of a cascode input stage 120, a cascode output stage 122, a dynamic biasing stage 124, a switch 126 and a switch 128. In track-and-hold circuit 200, switch 128 is connected between the gate of diode-connected transistor 152 and the gate of second cascode transistor 142. Thus, in track-and-hold circuit 200, second cascode transistor 142 is biased by the dynamic bias voltage generated by dynamic biasing stage 124 in response to the dynamic biasing current $I_B$. In track-and-hold circuit 200, the gate voltages of the first and second cascode transistors 132 and 142 are the same, and the drain voltage of output transistor 140 is well matched to that of input transistor 130. As a result, the accuracy of track-and-hold circuit 200 is similar to that of the above-described conventional track-and-hold circuit.

Switch 126 and switch 128 are synchronously operated by the mode control signal (not shown) so that the biasing state of second cascode transistor 142 is held by the gate capacitance thereof when track-and-hold circuit 200 is in its HOLD state. Switch 128 is typically implemented using an additional transistor, but another type of switching element may be used. In some implementations, switches 126 and 128 are synchronously operated by respective mode control signals that swing between different voltage levels.

Track-and-hold circuit 200 typically cannot operate at clock speeds as high as track-and-hold circuit 100 described above with reference to FIG. 3. In track-and-hold circuit 200, when switch 128 changes state, the signal path between the gate of diode-connected transistor 152 and the gate of second cascode transistor 142 is slower to settle than the signal path from input transistor 130 to output transistor 140. The slower settling time is due to the long time constant of the RC circuit composed of the effective resistance of biasing stage transistor 150 and the combined capacitances of switch 128 and the gate of second cascode transistor 142. In track-and-hold circuit 100, the gate of second cascode transistor 142 is biased by static bias voltage supply $V_B$. This eliminates the capacitance of switch 128 and the gate capacitance of second cascode transistor 142 from the time constant of the cascode signal path. This significantly reduces the delay of the track-and-hold circuit 100. Moreover, eliminating switch 128 has the additional advantage of reducing layout complexity.

As noted above, the accuracy of track-and-hold circuit 100 described above with reference to FIG. 3 is less than that of track-and-hold circuit 200. However, an embodiment of track-and-hold circuit 100 had an accuracy good enough to be used in an eight-bit analog-to-digital converter, for example.

A computer simulation of a pipeline ADC incorporating embodiments of track-and-hold circuit 100 described above with reference to FIG. 3 was compared with a computer simulation of a similar pipeline ADC incorporating embodiments of the conventional track-and-hold circuit 10 described above with reference to FIG. 1. The comparison showed that the pipeline ADCs were similar in signal-to-noise plus distortion ratio (SNDR) and operating speed but the pipeline ADC incorporating the embodiments of track-and-hold circuit 100 had only one-half of the power consumption.

The dynamic biasing current $I_B$ may be provided to track-and-hold circuit 200 by a dynamic biasing current generator similar to that shown in FIG. 4, by a dynamic biasing current generator similar to that shown in FIG. 5, or by a different type of dynamic biasing current generator.

Figure 7:
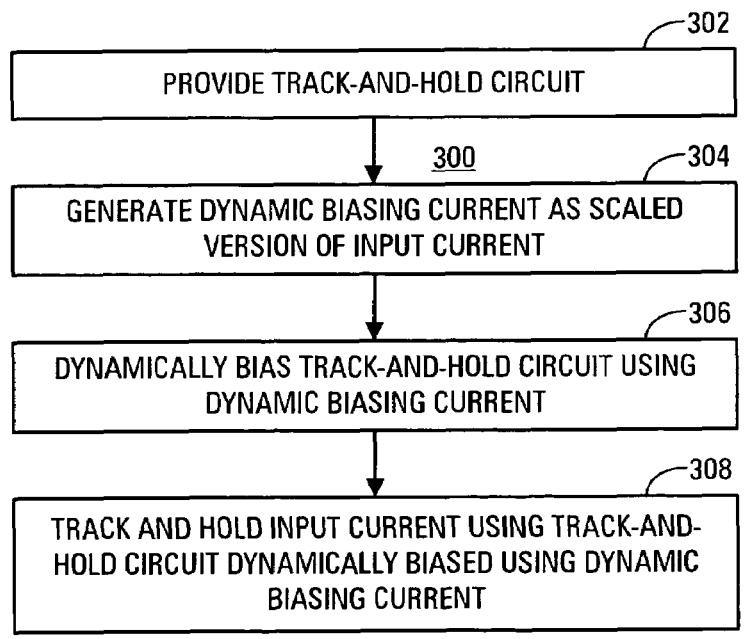
FIG. 7 is a flow chart illustrating an embodiment of a method in accordance with the invention for tracking and holding an input current.

FIG. 7 is a flow chart illustrating an exemplary embodiment of a method 300 in accordance with the invention for tracking and holding an input current.

In block 302, a current-mode track-and-hold circuit is provided.

In block 304, a dynamic biasing current is generated as a scaled version of the input current.

In block 306, the track-and-hold circuit is dynamically biased using the dynamic biasing current.

In block 308, the input current is tracked and held using the track-and-hold circuit dynamically biased using the dynamic biasing current.

In an embodiment of the method, the track-and-hold circuit has a cascode input stage and the cascode input stage is biased in response to the dynamic biasing current to bias the track-and-hold circuit.

The cascode input stage may be biased by providing a dynamic biasing stage, passing the dynamic biasing current through the dynamic biasing stage to generate a dynamic bias voltage and biasing the cascode input stage using the dynamic bias voltage.

In another embodiment, the track-and-hold circuit additionally has a cascode output stage biased using the dynamic bias voltage.

This disclosure describes the invention in detail using illustrative embodiments. However, the invention defined by the appended claims is not limited to the precise embodiments described.

I claim:

1. A current-mode track and hold circuit, comprising:
a cascode input stage connected to receive an input current, the cascode input stage comprising an input transistor and a cascode transistor;
a dynamic biasing stage connected to receive a scaled version of the input current as a dynamic biasing current, the dynamic biasing stage dynamically biasing the cascode transistor of the cascode input stage in response to the dynamic biasing current;
a cascode output stage; and
a switch operable to interconnect the input stage and the output stage.

2. The track-and-hold circuit of claim 1, in which:
the dynamic biasing stage comprises a diode-connected transistor and a biasing stage transistor connected in series; and
the dynamic biasing stage biases the cascode transistor of the cascode input stage through a connection between the diode-connected transistor and the cascode transistor.

3. The track-and-hold circuit of claim 2, in which:
the output stage comprises a second cascode transistor and an output transistor and provides an output current; and
the switch is connected between the input transistor and the output transistor.

4. The track-and-hold circuit of claim 3, in which:
each of the transistors comprises a source, a gate and a drain; and
in the output stage, the drain of the second cascode transistor provides the output current.

5. The track-and-hold circuit of claim 2, in which:
each of the transistors comprises a source, a gate and a drain; and
in the dynamic biasing stage, the drain and the gate of the diode-connected transistor are interconnected and are additionally connected to receive the dynamic biasing current and to the gate of the biasing stage transistor.

6. The track-and-hold circuit of claim 2, in which:
each of the transistors comprises a source, a gate and a drain; and
in the input stage, the drain of the cascode transistor is connected to receive the input current and is additionally connected to the gate of the input transistor.

7. The track-and-hold circuit of claim 1, in which the output stage is biased independently of the dynamic biasing stage.

8. The track-and-hold circuit of claim 7, in which:
the dynamic biasing stage comprises a diode-connected transistor and a biasing stage transistor connected in series; and
the dynamic biasing stage biases the cascode transistor of the cascode input stage through a connection between the diode-connected transistor and the cascode transistor.

9. The track-and-hold circuit of claim 8, in which:
the output stage comprises a second cascode transistor and an output transistor and provides an output current; and
the switch is connected between the input transistor and the output transistor.

10. The track-and-hold circuit of claim 9, in which:
each of the transistors comprises a source, a gate and a drain; and
in the output stage, the drain of the second cascode transistor provides the output current.

11. The track-and-hold circuit of claim 8, in which:
each of the transistors comprises a source, a gate and a drain; and
in the dynamic biasing stage, the drain and the gate of the diode-connected transistor are interconnected and are additionally connected to receive the dynamic biasing current and to the gate of the biasing stage transistor.

12. The track-and-hold circuit of claim 8, in which:
each of the transistors comprises a source, a gate and a drain; and
in the input stage, the drain of the cascode transistor is connected to receive the input current and is additionally connected to the gate of the input transistor.

13. The track-and-hold circuit of claim 1, in which:
the second cascode output stage comprises a cascode transistor and an output transistor; and
the dynamic biasing stage additionally biases the second cascode transistor of the output stage.

14. The track-and-hold circuit of claim 13, in which:
the switch is a first switch; and
the track-and-hold circuit additionally comprises a second switch connected between the dynamic biasing stage and the output stage.

15. The track-and-hold circuit of claim 14, in which:
the dynamic biasing stage comprises a diode-connected transistor and a biasing stage transistor connected in series; and
the dynamic biasing stage dynamically biases the cascode transistor of the cascode input stage through a connection between the diode-connected transistor and the cascode transistor.

16. The track-and-hold circuit of claim 15, in which:
the output stage provides an output current; and
the first switch is connected between the input transistor and the output transistor.

17. The track-and-hold circuit of claim 16, in which:
each of the transistors comprises a source, a gate and a drain; and
the first switch is connected between the gates of the input transistor and the output transistor.

18. The track-and-hold circuit of claim 16, in which the second switch is connected between the diode-connected transistor of the dynamic biasing stage and the second cascode transistor of the output stage.

19. The track-and-hold circuit of claim 18, in which:
each of the transistors comprises a source, a gate and a drain; and
the second switch interconnects the gates of the diode-connected transistor of the dynamic biasing stage and the second cascode transistor of the output stage.

20. The track-and-hold circuit of claim 17, in which:
each of the transistors comprises a source, a gate and a drain; and
in the output stage, the drain of the second cascode transistor provides the output current.

21. The track-and-hold circuit of claim 16, in which:
each of the transistors comprises a source, a gate and a drain; and
in the dynamic biasing stage, the drain and the gate of the diode-connected transistor are interconnected and are additionally connected to receive the dynamic biasing current and to the gate of the biasing stage transistor.

22. The track-and-hold circuit of claim 16, in which:
each of the transistors comprises a source, a gate and a drain; and
in the input stage, the drain of the cascode transistor is connected to receive the input current and is additionally connected to the gate of the input transistor.

23. The track-and-hold circuit of claim 13, additionally comprising a dynamic biasing current generator operable to generate the dynamic biasing current as the scaled version of the input current.

24. The track-and-hold circuit of claim 1, additionally comprising a dynamic biasing current generator operable to generate the dynamic biasing current as the scaled version of the input current.

25. The track-and-hold circuit of claim 1, in which the output stage is structured to generate an output current in a predetermined ratio to the input current.

26. A method of tracking and holding an input current, the method comprising:
   providing a current-mode track-and-hold circuit comprising a cascode stage;
   generating a dynamic biasing current as a scaled version of the input current;
   dynamically biasing the cascode stage of the track-and-hold circuit using the dynamic biasing current; and
   tracking and holding the input current using the track-and-hold circuit having the cascode stage dynamically biased using the dynamic biasing current.

27. The method of claim 26, in which:
   the cascode stage is a cascode input stage; and
   the dynamically biasing the cascode stage of the track-and-hold circuit comprises dynamically biasing the cascode input stage in response to the dynamic biasing current.

28. The method of claim 27, in which biasing the cascode input stage comprises:
   providing a dynamic biasing stage;
   passing the dynamic biasing current through the dynamic biasing circuit to generate a dynamic bias voltage; and
   biasing the cascode input stage using the dynamic bias voltage.

29. The method of claim 28, in which:
   the track-and-hold circuit additionally comprises a cascode output stage; and
   the method additionally comprises dynamically biasing the cascode output stage using the dynamic bias voltage.

30. The method of claim 27, in which:
   the track-and-hold circuit additionally comprises a cascode output stage; and
   the dynamically biasing the cascode stage of the track-and-hold circuit additionally comprises dynamically biasing the cascode output stage in response to the dynamic biasing current.

31. The method of claim 26, in which the tracking and holding comprises generating an output current in a predetermined ratio to the input current.

* * * * *

UNITED STATES PATENT AND TRADEMARK OFFICE
CERTIFICATE OF CORRECTION

| | |
|---|---|
| PATENT NO. | : 7,187,215 B2 |
| APPLICATION NO. | : 11/034990 |
| DATED | : March 6, 2007 |
| INVENTOR(S) | : Setterberg |

Page 1 of 1

It is certified that error appears in the above-identified patent and that said Letters Patent is hereby corrected as shown below:

In column 10, line 2, in Claim 13, after "the" delete "second".

In column 10, line 2, in Claim 13, after "a" insert -- second --.

Signed and Sealed this

Twenty-seventh Day of November, 2007

JON W. DUDAS
*Director of the United States Patent and Trademark Office*